United States Patent [19]
Hartmann

[11] Patent Number: 6,029,261
[45] Date of Patent: Feb. 22, 2000

[54] TEST CIRCUIT AND SYSTEM FOR INTERCONNECT TESTING OF HIGH-LEVEL PACKAGES

[75] Inventor: Wilfred Hartmann, Gechingen, Germany

[73] Assignee: International Business Machines Corporation, Armonk, N.Y.

[21] Appl. No.: 08/977,299

[22] Filed: Nov. 24, 1997

[30] Foreign Application Priority Data

Oct. 14, 1997 [EP] European Pat. Off. .............. 97117736

[51] Int. Cl.$^7$ ................................................ G01R 31/28
[52] U.S. Cl. ............................................................ 714/724
[58] Field of Search ..................................... 714/724, 726

[56] References Cited

U.S. PATENT DOCUMENTS 4,428,060  1/1984  Blum ...................................... 364/715
5,239,262  8/1993  Gruetzner et al. ................... 324/158 R
5,444,715  8/1995  Gruetzner et al. ..................... 371/22.3
5,477,548  12/1995 Beenker et al. ........................ 371/22.3
5,497,378  3/1996  Amini et al. ........................... 371/22.3

*Primary Examiner*—Albert De Cady
*Assistant Examiner*—Samuel Lin
*Attorney, Agent, or Firm*—Marc A. Ehrlich; Lynn L. Augspurger

[57] ABSTRACT

The invention relates to a test circuit and a test system which provides interconnect test capability for modules and boards. The test circuit comprises a plurality of scan chains, including a plurality of registers. The registers in each module or board are logically sorted such that identical registers are arranged successively.

1 Claim, 2 Drawing Sheets

TEST CIRCUIT AND SYSTEM FOR INTERCONNECT TESTING OF HIGH-LEVEL PACKAGES

The invention relates to a circuit and system which provides interconnect test capability on an automated test equipment (ATE) system for high-level packages like, e.g., multi chip modules (MCMs) or printed circuit boards (PCBs).

One of the best known test methods for testing large scale integrated circuits is level sensitive scan design (LSSD) which is described in the article "A Logic Design Structure for LSI Testability", Proceedings of the Design Automation Conference, No. 14, 20–22, June 1977, New Orleans, La., by E. B. Eichelberger. See also U.S. Pat. No. 4,590,078, U.S. Pat. No. 4,428,060 and E. J. McCluskey, "A Survey of Design for Testability Scan Techniques", VLSI Design, December 1984, pp. 38–61, for a comprehensive list of patents and publications for the testing of electronic structures.

Cordt W. Starke, "Design for Testability and Diagnosis in a VLSI CMOS System/370 Processor", IBM Journal of Research and Development, Volume 34, No. 2/3, March/May 1990, pp. 355–362, describes a design of combinational logic circuits which incorporates on-chip test pattern generation and on-chip test response evaluation for logic fault detection. In this paper, the combinational logic circuits are coupled together in a typical level-sensitive scan design (LSSD) by shift register latches (SRLs) which are configured to form a test scan path. The test patterns are generated by a linear feed back shift register (LFSR) which is configured in a pseudo random pattern generator (PRPG) and which is implemented on the chip. To apply a test pattern, the shift register latches are loaded via the test scan path. Then the system clocks are pulsed once in order to execute one operational cycle of the system. After the system clocks have been applied, the test response is shifted out of the shift register latches via the test scan path for further evaluation. However, the above cited prior art is silent as to interconnect testing of chips or modules and only refers to the interal testing of a chip.

IEEE Standard 1149.11 and C. M. Maunder, R. E. Tulloss, "The Test Access Port and Boundary-Scan Architecture", IEEE Computer Society Press, 1990, describe a boundary scan architecture which—in principle—allows the testing of chip interconnections. One disadvantage of this architecture is the long simulation time and the test data volume handling for very complex PCBs.

In IBM Technical Disclosure Bulletin, Volume 34, No. 6, November 1991, pp. 325–330, by P. K. Graham, an AC interconnect test with series boundary scan is described. If an interconnection between two IC chips is to be tested according to this method, first an enable signal is applied to the corresponding driver. After the enabled driver is switched on, a receiver clock is pulsed to capture the initialisation values into the receiver latches. Only at this point, the timed portion begins. The B-clock of the system is pulsed to the driver data latch. Then, in a minimal, worst case-time after the B-clock, the receiver clock (C-clock) is pulsed to capture the driver data transitions in the receiver boundary latches. This is the end of the time portion. Thus this prior art test method does not provide for an interconnect test that simulates system operation in the functional mode. Other approaches are known from P. P. Fasng, "Microbit Brings Self- Testing on Board Complex Micro Computers", Electronics, Mar. 10, 1982, pp. 116–119, and K. D. Wagner, T. W. Williams, "Enhanced Board Functional Self-Test by Concurrent Sampling", International Test Conference 1991, pp. 633–640. Again these test methodologies do not provide for the simulation of high speed data links between chips or modules which occur in the functional mode.

Another known technique for interconnect testing of chips is the usage of an in-circuit tester, whereby a test head is applied to the circuit under test. The test head has a "bed of nails", i.e., a plurality of test needles serving to contact the circuit components under test. This technique is disadvantageous in that the testing frequency is restricted due to the usage of test needles and their associated capacitance and signal delay. A further problem of that technique is the mechanical tolerance of the test needles.

EP-A-0 642 083 describes a test circuit which provides interconnect capability for chips. Each of the chips comprises combinational logic as well as a plurality of scan chains. Test data is shifted into the scan chains from pattern generators and is then transmitted from a selected sending chip via its transceiver means to the receiving chip. The chip is selected by a selector which is integrated in the chip. During an interconnect test sequence different ones of the chips comprised in the test system are selected by the selector. However, this test circuit has the disadvantage that there is a need to provide a logical model for the test data on the higher packaging level. Providing this model requires a great expenditure of calculating the test data in advance. Furthermore, errors can be detected but not exactly localized.

It is therefore an object of the present invention to provide an improved test circuit and method which allows an improvement over the prior art in terms of test data generation, simulation time and diagnosis capability for interconnect testing of modules and PCBs.

It is a further object of the present invention to provide a test circuit and method that is able to localize detected errors.

These and other objects are achieved by the features laid down in the independent claims. Preferred embodiments of the invention are given in the dependent claims.

The invention allows the interconnect testing of highly complex MCMs and PCBs by arranging the different boundary scan chains in a special sequence, thereby effecting the test generation manually at the tester. Besides the classical tests with respect to shorts and opens, the drivers and receivers can also be checked in view of dynamic fields. A particular advantage of this invention is the fact that in case of an error the defective net or module pin can be exactly identified without any fault simulation.

According to a preferred embodiment of the invention an AC interconnect test is performed. It has to be noted that the test method according to the present invention is not restricted to AC test only, but can also be used with DC testing. However, for the sake of simplification, only AC testing is described in the following. As compared with the above described prior art the invention provides an improved AC/DC interconnect test generation and diagnostic capability, since for the generation of the test information like initialisation, control of the design for testability (DFT), chain length of the driver and receiver registers and, if necessary, inversions in the scan path are sufficient. This test data can be generated manually at the tester, thereby rendering superfluous the generation of a logical model on the higher packaging level. Furthermore, no simulation has to be carried out, since for the test data generation, only cards are used that proved to be perfect (Golden Cards).

In the following, the invention will be described in more detail with the help of the drawings in which FIG. 1 shows an I/O circuit typically used;

Figure 1:
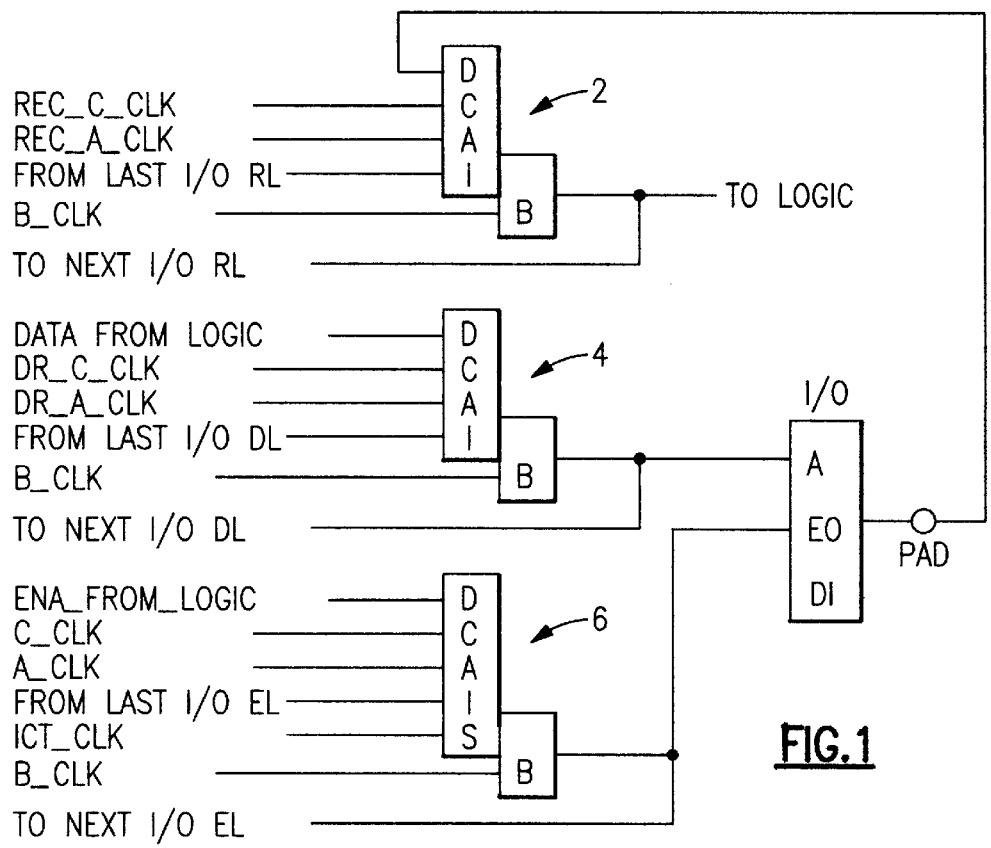

FIG. 1 shows an I/O circuit for a 3-state bidirectional pin typically used having three registers, namely receiver registers 2, driver registers 4 and enable registers 6. The bidirectional pin is either input or output by utilizing the receiver or driver register. The enable register and the DI pin of the driver are required to control the activity of the output driver.

Figure 2:
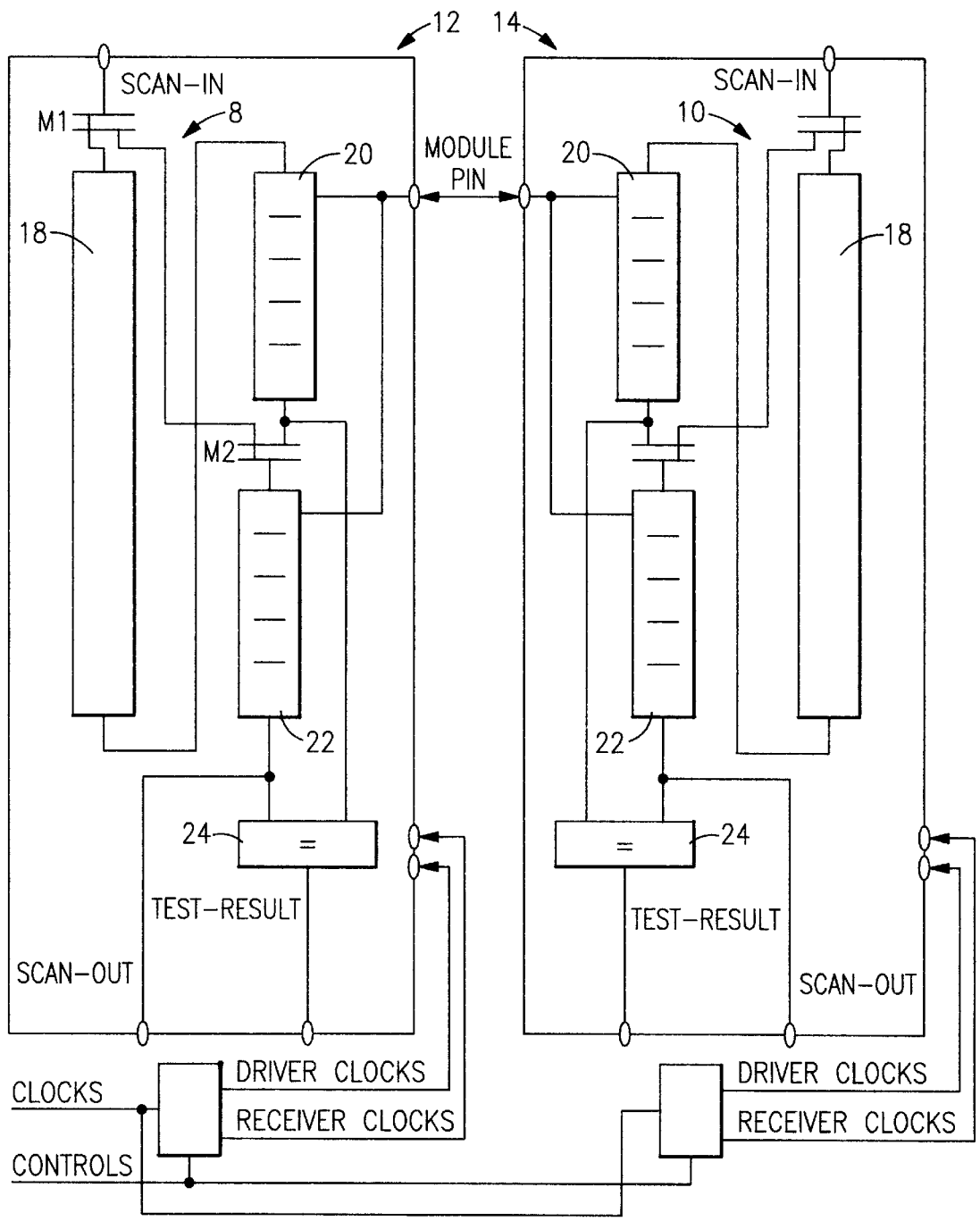
FIG. 2 illustrates the arrangement of the boundary scan chains according to the present invention.

FIG. 2 illustrates the arrangement of the boundary scan chains 8, 10 on two Single Chip Modules (SCM) 12, 14 according to the invention. It can be seen that all enable registers 18 of each different module (only two 12, 14 are shown in FIG. 2) are arranged one behind the other, subsequently all receiver registers 20 are arranged one behind the other and finally, all driver registers 22 are arranged one behind the other. Given this arrangement, the following test sequence can be carried out:

First the receiver 20 and driver 22 registers are initialized with a logical "0". Subsequently the enable registers 18 of module 12 are initialized. This can, e.g., be done with the so-called ICT Clock and ICT Gate according to U.S. Pat. No. 5,444,715 which is hereby incorporated by reference.

Following this initialisation, the driver registers 22 of module 12 are loaded with test data via multiplexers M1 and M2. The test data can be either random or deterministic. Thereby "random" means that the data have been generated by using a PRPG.

Figure 4:
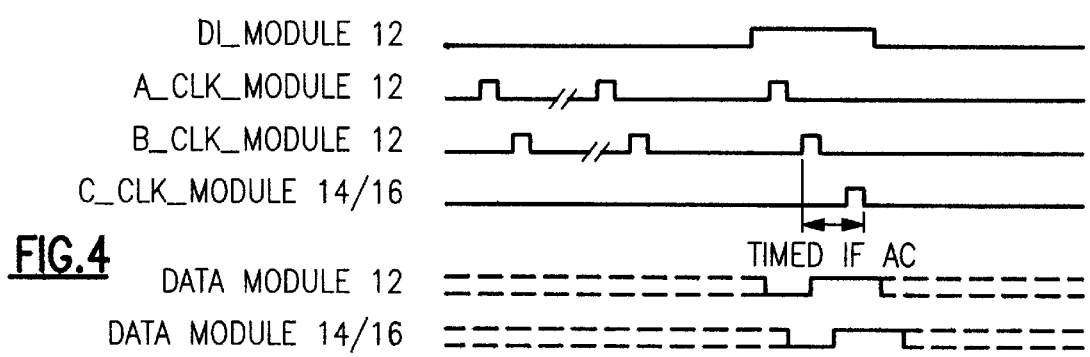
FIG. 4 illustrates the signal transitions from one module to another according to the invention.

Next, module 12 is switched into the driving mode and module 14 is switched into the receiving mode. After an A/B Clock pulse (cf. FIG. 4) the data is available at the driver outputs of module 12. The data is loaded in parallel on the rising edge of the C-Clock of module 14 (C_Clk_Mod 14) into the receiver registers 20 of module 14. If AC test coverage is needed, A/B and C pulses must be timed.

In case an AC test is to be carried out, it is necessary that with the next B-clock (cf. FIG. 4) a transition from "0" to "1" or from "1" to "0" takes place at the output of the drivers of module 12 (test data). This transition in combination with the timed B/C clock cycle is needed to detect delay defects which cause a device to switch more slowly than its worst case specification. In case a normal short/open test is carried out, it is sufficient if the desired value is present at the output of the drivers.

After having stored the data, all drivers will be switched to the high impedance state.

Subsequently, the data stored in module 14 will be loaded into the driver registers of the same module. Thereafter, module 14 will be switched into the driving mode and module 12 will receive the data.

In case there is no error, the contents of the receiver 20 and driver registers 22 assigned to module 12 will be the same. FIG. 2 shows a comparator 24 assigned to module 12 that will check whether this is the case when reading the chains.

These steps can now be repeated with the amount of patterns needed for a short-test. Thereafter the test will again be repeated using an opposite initialisation.

It has to be noted that the test sequence can be changed so that the test data is first loaded into the driver registers 20 of module 14. In this case, comparator 24 assigned to module 14 will check if the contents of the receiver 20 and driver registers 22 of module 14 is the same.

FIG. 2 only shows the test circuit according to the invention using two different modules. However, the proposed test method can be used equally for boards having more than two modules.

Figure 3:
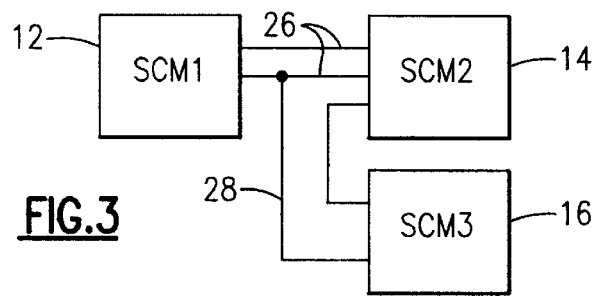
FIG. 3 shows a possible net configuration using three Single Chip Modules.

This is schematically shown in FIG. 3, where a possible net configuration using three different Single Chip Modules is illustrated.

Generally, only one Single Chip Module (SCM) or one chip when regarding a Multi Chip Module (MCM) can be switched into the driving mode. All other modules can only receive data at this stage.

The sequence of the AC/DC Interconnect test is as follows:

First all receiver and driver registers of the Single Chip Modules 12, 14, 16 are initialized with a logic "0".

The enable registers of module 12 are loaded with a value that is necessary to switch the drivers into the active state. This, as already described above, can be done by using the signals ICT Clock and ICT Gate.

Next, the driver registers of module 12 (cf. FIG. 2) are loaded with the desired test data via multiplexers M1 and M2. Subsequently, module 12 is switched to the driving mode and modules 14 and 16 are switched to the receiving mode, depending on the control logic used.

With the A/B and C pulses the data is stored in modules 14 and 16.

After this B/C cycle all modules are switched to the high impedance state. This is, e.g., done using the driver inhibit signal.

The data received in modules 14 and 16 is now loaded from the receiver registers into the driver registers. Subsequently, module 12 is switched to the receiving mode and receives data from module 14 via the interconnections 26.

Thereafter, module 16 has its turn and transmits the received data back via the interconnection 28. When using more than two modules or signal nets connected to more than two modules (e.g., interconnections 28), a special sequence with respect to sending back the data has to be defined, in order to guarantee that all receivers have been tested. Such a sequence is shown in the Table for three modules 12, 14 and 16. In this case, i.e., when using three modules, sending back the data is needed twice because an overwriting of a wrong result is feasible. Therefore, each receiver (module) will be used in the second backdriving cycle for one time.

TABLE

| | Driver/Receiver Modus | | | |
| --- | --- | --- | --- | --- |
| Driving Module | First Backdriving Module | Second Backdriving Module | Driver Test for Module | Receiver Test for Module |
| 12 | 14 | 16 | 12 | 16 |
| 14 | 16 | 12 | 14 | 12 |
| 16 | 12 | 14 | 16 | 14 |

The scanouts of the receiver- and driver chains are connected to a comparator device 24 assigned to each module (FIG. 2). When reading the chains it is checked whether both chains are identical via the output of the comparator. In case there is no error, the output will always carry a logical "0" or "1".

If an error occurs, i.e., the chains are not identical, the tester points to the register carrying the erroneous data. In this case, it is possible to detect the erroneous net by using an appropriate computer program.

The test steps are then repeated using the necessary amount of test patterns. Since no simulation is performed, the test has to be repeated with module 14 and module 16 using opposite initialization. This is necessary to guarantee that the inverted value was once present in the receiving module.

Again it has to be noted that it is not necessary that the test data will first be loaded into the respective registers of module 12, but it is also possible to load the data into the registers of modules 14 or 16 or any other module present, i.e., each module can be loaded with the test data in the first place.

I claim:

1. A test circuit adapted to provide interconnect test capability for higher level circuit packages each forming a circuit of modules or boards, said higher level circuit packages each comprising a circuit package for detecting and localizing errors with circuit package level circuitry including a plurality of scan chains, a plurality of testable registers for each scan chain accessible for testing which are arranged such that registers of identical function are arranged successively in a chain such that all receiver registers are arranged in a chain one behind one another, and all driver registers are arranged in a chain one behind one another, and wherein for testing said both said receiver register chain and driver register chain are initialized with a logical zero, and where subsequently during testing, the receiver register and driver register scan chains of a circuit package are loaded with test data, a comparator for each circuit package for receiving a test signal from said scan chains, said comparator being arranged to test said testable registers by comparing the data contents of a plurality of respective registers after they have been loaded with test data to determine a value of the contents of each register being tested to establish the contents of said respective registers of each chain by the logical output of the comparator during scanout of the receiver registers and driver register chains via the output of said comparator, said comparator responsive to a comparator determination of unequal contents of a plurality of respective registers at the output of said comparator causing said respective registers to change the state of their respective contents to enable an opposite initialization for a repeat of the test to verify that an erroneous net was detected when the output of the chains at the comparator output is not identical.

* * * * *

UNITED STATES PATENT AND TRADEMARK OFFICE
CERTIFICATE OF CORRECTION

PATENT NO. : 6,029,261
DATED : February 22, 2000
INVENTOR(S) : Hartmann

It is certified that error appears in the above-identified patent and that said Letters Patent is hereby corrected as shown below:

Title page,
Item [22], Filing date should be -- November 25, 1997 --.

Signed and Sealed this

Twentieth Day of November, 2001

Attest:

*Nicholas P. Godici*

NICHOLAS P. GODICI
*Attesting Officer*     *Acting Director of the United States Patent and Trademark Office*